(12) United States Patent
Ou-Yang et al.

(10) Patent No.: US 12,074,603 B1
(45) Date of Patent: Aug. 27, 2024

(54) LEAKAGE-FREE DUMMY CELL FOR SEMICONDUCTOR DEVICES

(71) Applicant: TAIWAN SEMICONDUCTOR MANUFACTURING COMPANY LTD., Hsinchu (TW)

(72) Inventors: Yu-Jheng Ou-Yang, Hsinchu (TW); Chi-Lin Liu, New Taipei (TW); Shang-Chih Hsieh, Taoyuan (TW); Wei-Hsiang Ma, Taipei (TW); Kai-Chi Huang, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/313,384

(22) Filed: May 8, 2023

(51) Int. Cl.
   *H03K 3/037* (2006.01)
   *H03K 3/3562* (2006.01)

(52) U.S. Cl.
   CPC ......... *H03K 3/0372* (2013.01); *H03K 3/0375* (2013.01); *H03K 3/35625* (2013.01)

(58) Field of Classification Search
   CPC . H03K 3/0372; H03K 3/3562; H03K 3/35625
   See application file for complete search history.

(56) References Cited

U.S. PATENT DOCUMENTS

2023/0253961 A1* 8/2023 Chien ................ H03K 3/35625
                                                    327/202

* cited by examiner

*Primary Examiner* — Patrick O Neill
(74) *Attorney, Agent, or Firm* — WPAT LAW; Anthony King

(57) ABSTRACT

The present disclosure provides a semiconductor device which includes a multiplexer, a master latch, and a slave latch. The multiplexer outputs an inverse of an input data signal or an inverse scan input signal according to a scan enable signal. The master latch is coupled to an output terminal of the multiplexer, and is configured to latch the inverse of the input data signal based on an input clock signal in response to the scan enable signal being in a low-logic state. The slave latch is coupled to the output terminal of the multiplexer through a first clocked CMOS inverter, and is configured to receive the input data signal and to output a latched slave latch data based on the input clock signal. A leakage-free dummy cell is disposed in a non-critical path of the master latch and the slave latch.

20 Claims, 14 Drawing Sheets

US 12,074,603 B1

LEAKAGE-FREE DUMMY CELL FOR SEMICONDUCTOR DEVICES

BACKGROUND

The present disclosure relates to digital circuits, and, in particular, to semiconductor devices using leakage-free dummy cells.

Sequential cells, such as scannable D flip-flops and data latches, are frequently used in systems-on-chip (SoC) to store or latch data values therein. However, with increasing transistor counts in SoCs, it is challenging to reduce power leakage, especially in semiconductor devices manufactured using deep-micron technologies.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1A:
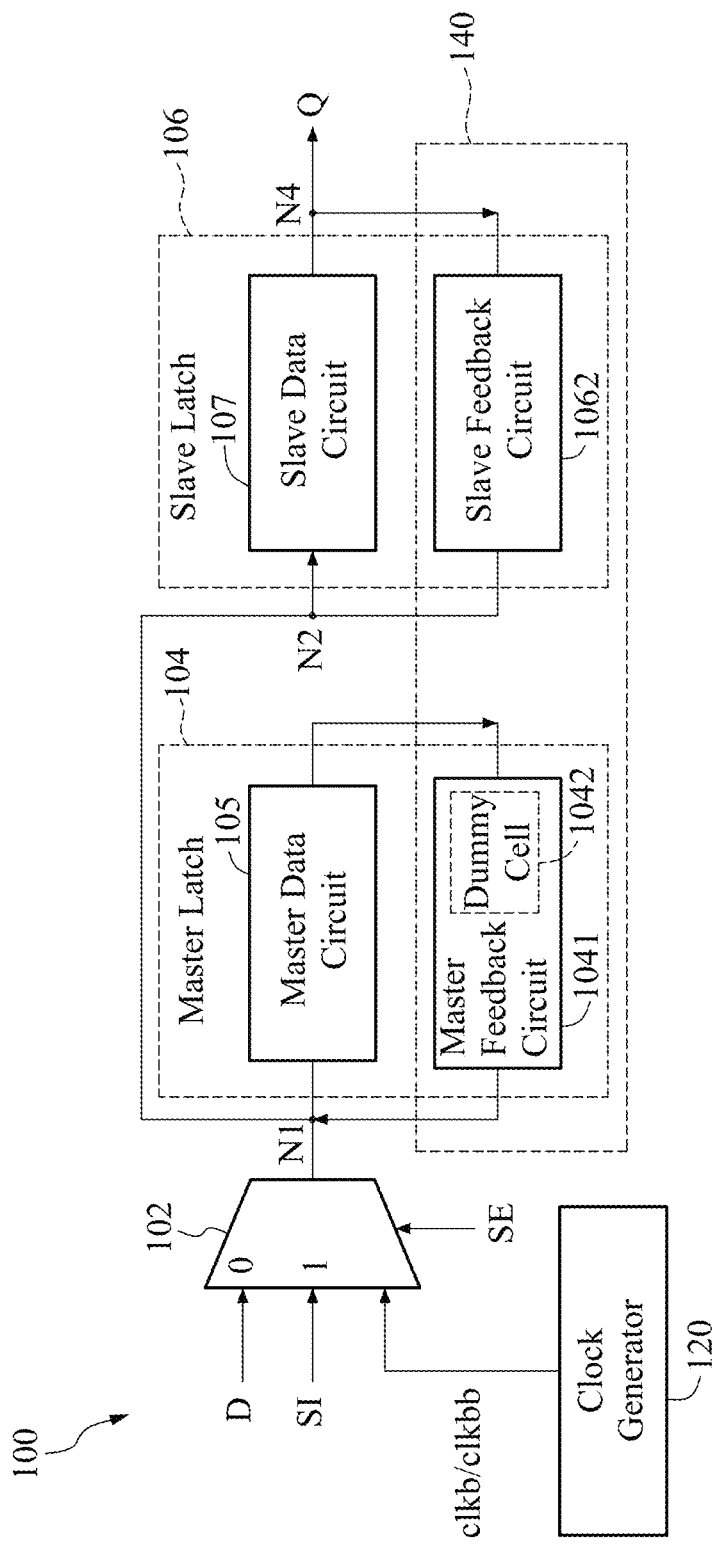
FIG. 1A is a block diagram of a scannable D flip-flop in accordance with an embodiment of the disclosure.

The following disclosure provides multiple embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

Figure 1B:
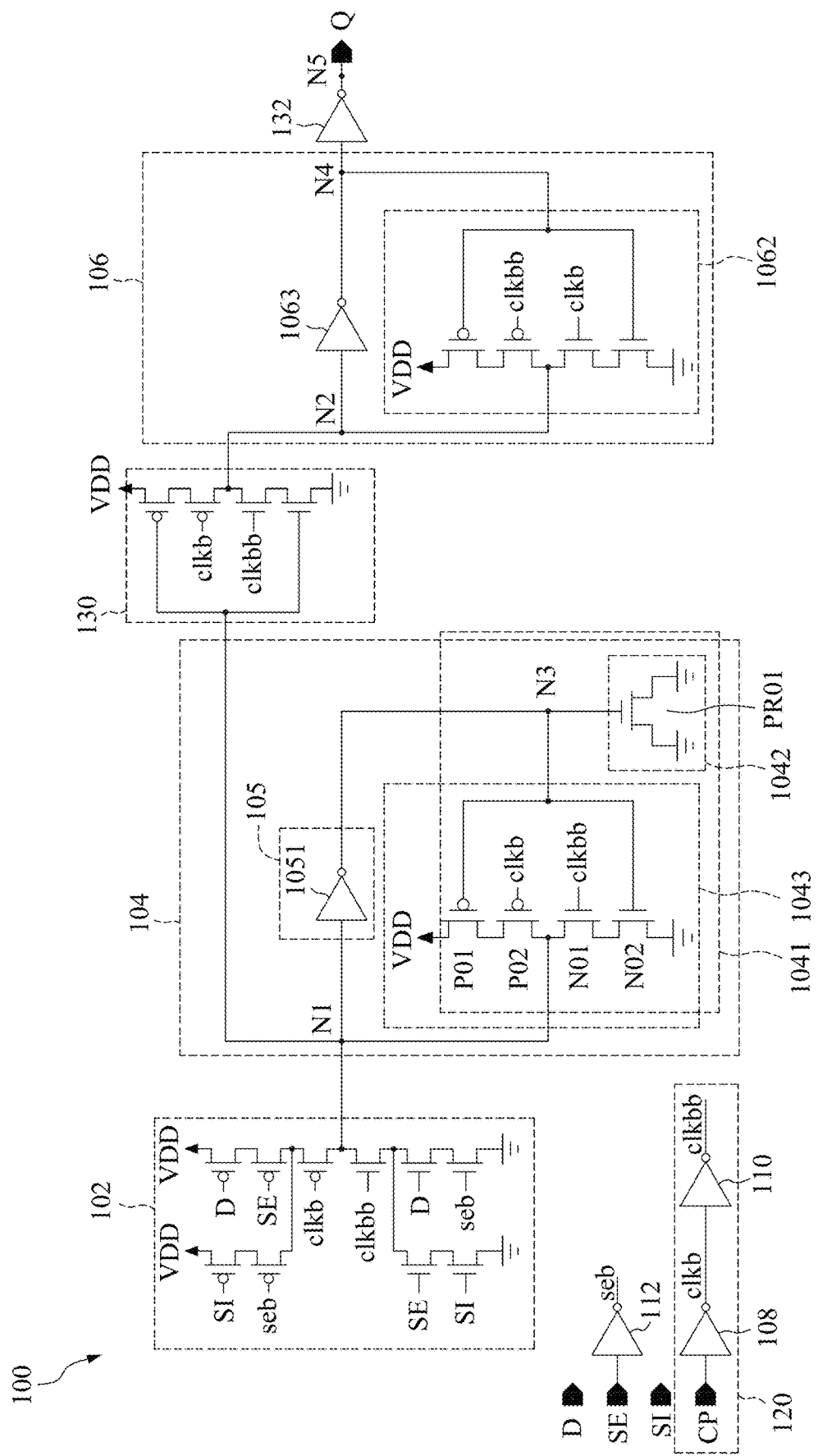
FIG. 1B is a schematic diagram of a scannable D flip-flop in accordance with the embodiment of FIG. 1A.

FIG. 1A is a block diagram of a scannable D flip-flop 100 in accordance with an embodiment of the disclosure. FIG. 1B is a schematic diagram of the scannable D flip-flop 100 in accordance with the embodiment of FIG. 1A. Please refer to both FIGS. 1A and 1B.

In an embodiment, the scannable D flip-flop 100 may be integrated into an integrated circuit (IC) having a built-in self-test (BIST) function. The scannable D flip-flop 100 may include a multiplexer 102, a master latch, and a slave latch 106. The multiplexer 102 may select a data signal D or a scan input signal SI as its output signal according to a scan enable signal SE. For example, when in response to the scan enable signal SE being in a high-logic state (e.g., '1'), the scannable D flip-flop enters the BIST mode, and the multiplexer 102 may select the scan input signal SI (e.g., from external test equipment), and output the inverse scan input signal SI' as its output signal at the output terminal (i.e., node N1) of the multiplexer 102. In response to the scan enable signal SE being in a low-logic state (e.g., '0'), the scannable D flip-flop enters the normal mode, and the multiplexer 102 may select the data signal D, and output the inverse data signal D' as its output signal at the output terminal (node N1). In this case, the inverse data signal D' may be fed to the master latch 104 and the slave latch 106 that constitute a D flip-flop, so the inverse data signal D' can be retained by the master latch 104 and the slave latch 106.

Specifically, when the scannable D flip-flop 100 is in the normal mode (i.e., SE=0), the inverse data signal D' may be transmitted to the master data circuit 105 of the master latch 104, and the output data of the master data circuit 105 fed back to the output terminal (i.e., node N1) of the multiplexer 102 through the master feedback circuit 1041, as shown in FIG. 1A. In addition, the inverse data signal D' at node N1 is further sent to the slave data circuit 107 of the slave latch 106. The output data of the slave data circuit 107 (e.g., at node N4) is fed back to the input terminal of the slave latch 106 (i.e., node N2) through the slave feedback circuit 1062, as shown in FIG. 1A. For brevity, a clocked CMOS (complementary metal oxide semiconductor) inverter 130 coupled between nodes N1 and N2, and an inverter 132 coupled to node N4 are omitted from FIG. 1A, and the clocked CMOS inverter 130 and the inverter 132 are illustrated in the schematic diagram in FIG. 1B.

It should be noted that the critical path of the scannable D flip-flop 100 may refer to the data path from node N1 to the output terminal (i.e., node N4) of the scannable D flip-flop 100. Since the master feedback circuit 1041 is in a non-critical path (e.g., the master feedback path and the slave feedback path in block 120) of the scannable D flip-flop 100, a dummy cell 1042 is disposed in the master feedback circuit 1041 so as to reduce the leakage current of the scannable D flip-flop 100. In general, a non-critical path can refer to one or more conductive paths, such that the signals transmission thereon will not delay the overall operation of the system.

Please refer to FIG. 1B. Given that the scan enable signal SE is in the low-logic state, the inverse data signal D' at node N1 passes through the inverter 1051, and a data signal D is obtained at node N3. In some embodiments, the dummy cell 1042 can be implemented using a transistor PR01 (e.g., an N-type transistor). The gate of the transistor PR01 is connected to node N3, and the source and drain of the transistor Q1 are grounded. Thus, the leakage current of the scannable D flip-flop 100 can be significantly reduced due to the transistor PR01, wherein the transistor PR01 can be regarded as a leakage-free dummy cell.

In addition, in the master feedback path, a clock CMOS inverter 1043, which includes transistors P01-P02 (e.g., P-type transistors) and transistors N01-N02 (e.g., N-type transistors), is used. The clocked CMOS inverter can be implemented using a stacked-transistor structure, as shown in FIG. 1B. For example, the transistors P01-P02 and transistors N01-N02 can be connected in series. The gates of the transistors P01 and N02 are connected to node N3. The gate of the transistor P02 is connected to the inverse clock signal clkb, and the gate of the transistor N01 is connected to the clock signal clkbb. In some other embodiments, a CMOS transmission gate can be disposed on the master feedback path, but the disclosure is not limited thereto.

When the scannable D flip-flop 100 is in the normal mode (i.e., SE=0), the inverse data signal D at node N1 passes through the clocked CMOS inverter 130. The output signal at the output terminal (i.e., node N4) of the slave data circuit 107, which is implemented using inverter 1063, is fed back to node N2 through the slave feedback circuit 1062 that is implemented by a clocked CMOS inverter. The signal at node N4 passes through the inverter 132 to generate the output signal Q of the scannable D flip-flop 100. It should be noted that although the inverse data signal D' is output by the multiplexer 102 when the scan enable signal SE is in the low-logic state, the logic state of the output signal Q may be aligned to that of the data signal D because the inverse data signal D1' at the output terminal (i.e., node N5 in FIG. 4B) of the slave latch 106 passes through the inverter 132 to obtain the output signal Q.

The operations of the clocked CMOS inverters 130, 1043, and 1062 in FIG. 1B are similar. For example, the logic states of the clock signal elkbb and the inverse clock signal clkb are complementary, that is, when the clock signal clkbb is in the high-logic state, the inverse clock signal clkb is in the low-logic state. When the clock signal clkbb is in the low-logic state, the inverse clock signal is in the high-logic state.

Specifically, taking the clocked CMOS inverter 1043 in the master feedback circuit 1041 as an example, the clocked CMOS inverter 1043 includes transistors P01-P02 (e.g., P-type transistors) and transistors N01-N02 (e.g., N-type transistors). When the clock signal clkbb is in the high-logic state and the inverse clock signal clkb is in the low-logic state, the transistors N01 and P02 are turned on. Accordingly, the clocked CMOS inverter 1043 is in operating mode to act as an inverter, and the input signal of the clocked CMOS inverter 1043 is inverted. For example, when node N3 is in the high-logic state, node N1 will be in the low-logic state. When node N3 is in the low-logic state, node N1 will be in the high-logic state.

When the clock signal clkbb is in the low-logic state and the inverse clock signal clkb is in the high-logic state, the transistors N01 and P02 are turned off, and the output terminal (i.e., node N1) of the clocked CMOS inverter 1043 will be in high-Z state.

Figure 2:
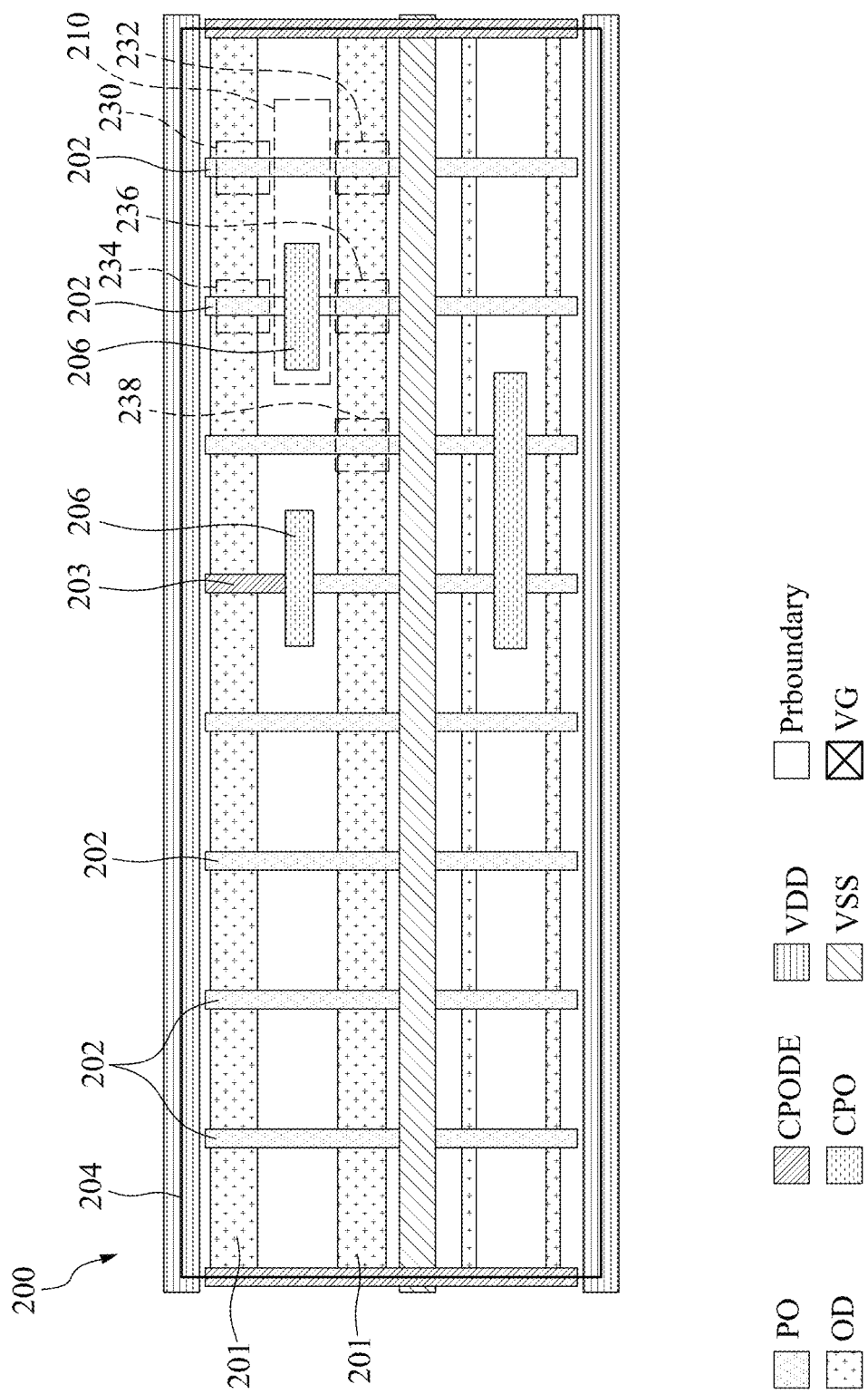
FIG. 2 is a layout diagram of the master feedback circuit 1041 in accordance with the embodiment of FIG. 1B.

FIG. 2 is a layout diagram of the master feedback circuit 1041 in accordance with the embodiment of FIG. 1B. Please refer to FIGS. 1A-1B and FIG. 2.

The layout diagram 200 may include oxide diffusion (OD) regions 201, polysilicon (PO) regions 202, poly-on-diffusion-edge (CPODE) region 203, and cut-poly-off (CPO) regions 206. The "prBoundary" 204 may refer to a shape outlining the perimeter of the layout (i.e., the outermost boundaries in the layout). The transistors P01-P02, N01-N02, and PR01 of the clocked CMOS inverter 1043 in the master feedback circuit 1041 are shown in the upper-right portion of the layout diagram 200. Specifically, the transistor P01 is formed on an intersection region 230 between the upper OD region 201 and the corresponding polysilicon 202, and the transistor PR01 is formed on an intersection region 232 between the lower OD region 201 and the corresponding polysilicon 202. The transistor P02 is formed on an intersection region 234 between the upper OD region 201 and an upper portion of the corresponding polysilicon 202. The transistor N01 is formed on an intersection region 236 between the lower OD region 202 and a bottom portion of the corresponding polysilicon 202. The transistor N02 is formed on an intersection region 238 between the lower OD region 202 and the corresponding polysilicon 202.

The gates of the transistors P02 and PR01 are connected through the corresponding polysilicon 202. Since the transistor P01 is connected to the transistor P02 in the schematic diagram shown in FIG. 1B, the physical layout of the transistor P02 (e.g., intersection region 234) is next to the transistor P01 (e.g., intersection region 230) in the layout diagram 200.

Similarly, since the transistor N02 is connected to the transistor N01 in the schematic diagram shown in FIG. 1B, the physical layout of the transistor N02 (e.g., intersection region 238) is placed next to the transistor N01 (e.g., intersection region 236) in the layout diagram 200. It should be noted that the polysilicon 202 that is disposed on the OD regions 201 of the transistors P02 and N01 is "cut off" (or spaced apart) by the CPO region 206. That is, the transistors P02 and N01 are spaced apart by the CPO region 206. However, the polysilicon 202 that is disposed on the OD regions 201 of the transistors P01 and PR01 is not cut off by the CPO region 206. Thus, the leakage current of the scannable D flip-flop 100 can be significantly reduced due to the transistor PR01, wherein the transistor PR01 can be regarded as a leakage-free dummy cell. In addition, the threshold voltage of the transistors P02 and N01 can be reduced due to the layout effect of the CPO region 206. In addition, the leakage current of the scannable D flip-flop 200 can be reduced, and the operating speed of the D flip-flop 200 can be improved.

Figure 3A:
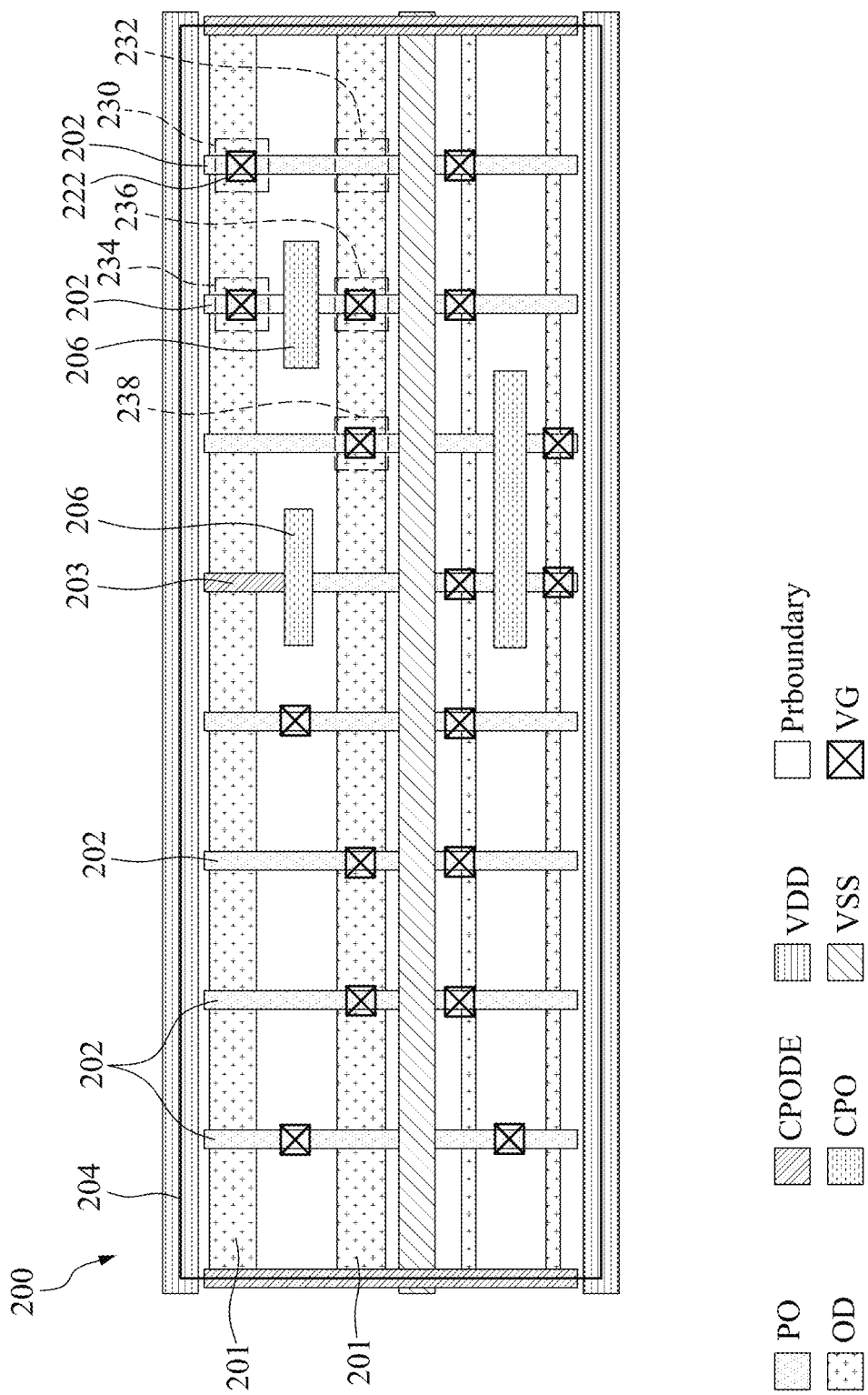
FIG. 3A is another layout diagram in accordance with the embodiment of FIG. 1B.
Figure 3B:
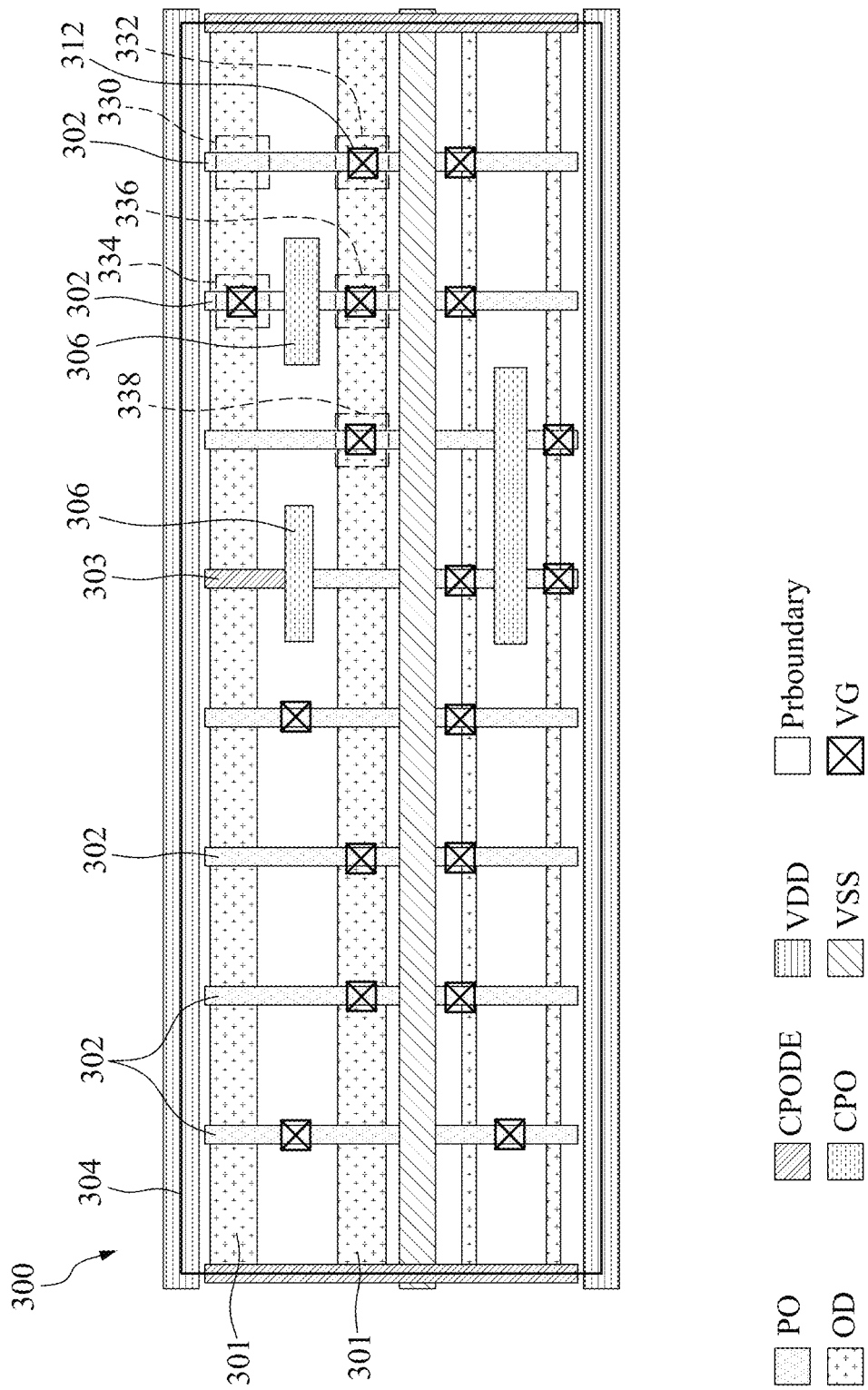
FIG. 3B is yet another layout diagram in accordance with the embodiment of FIG. 1B.

FIG. 3A is another layout diagram in accordance with the embodiment of FIG. 1B. FIG. 3B is yet another layout diagram in accordance with the embodiment of FIG. 1B. Please refer to FIGS. 1A-1B and FIGS. 3A-3B.

FIG. 3A is derived from the layout diagram 200 in FIG. 2. For example, a gate via (VG) 222 is formed on the gate of the transistor P0I so the power supply voltage VDD can be provided to the gate of the transistor P01, as shown in FIG. 3A. It should be noted that since the gate of the transistor PR01 is connected to the gate of the transistor PR01 through the corresponding polysilicon 202, the power supply voltage VDD is also provided to the gate of the transistor PR01.

The layout diagram 300 of FIG. 3B is slightly different from layout diagram 200 of FIG. 3A, but the relative positions of the transistors P01-P02, N01-N02, and PR01 in FIG. 3B are similar to those in FIG. 3A. For example, the gate via (VG) 312 for both the transistors P01 and PR01 to receive the power supply voltage VDD is formed on the intersection of the polysilicon 302 and the OD region 303 corresponding to the transistor PR01, as shown in FIG. 3B. Due to the layout effect, when the gate via (VG) is moved from the transistor P01 (e.g., FIG. 3A) to the transistor PR01 (e.g., FIG. 3B), current leakage from the scannable D flip-flop 300 can be further reduced, and operating speed of the D flip-flop 300 increased.

Figure 4A:
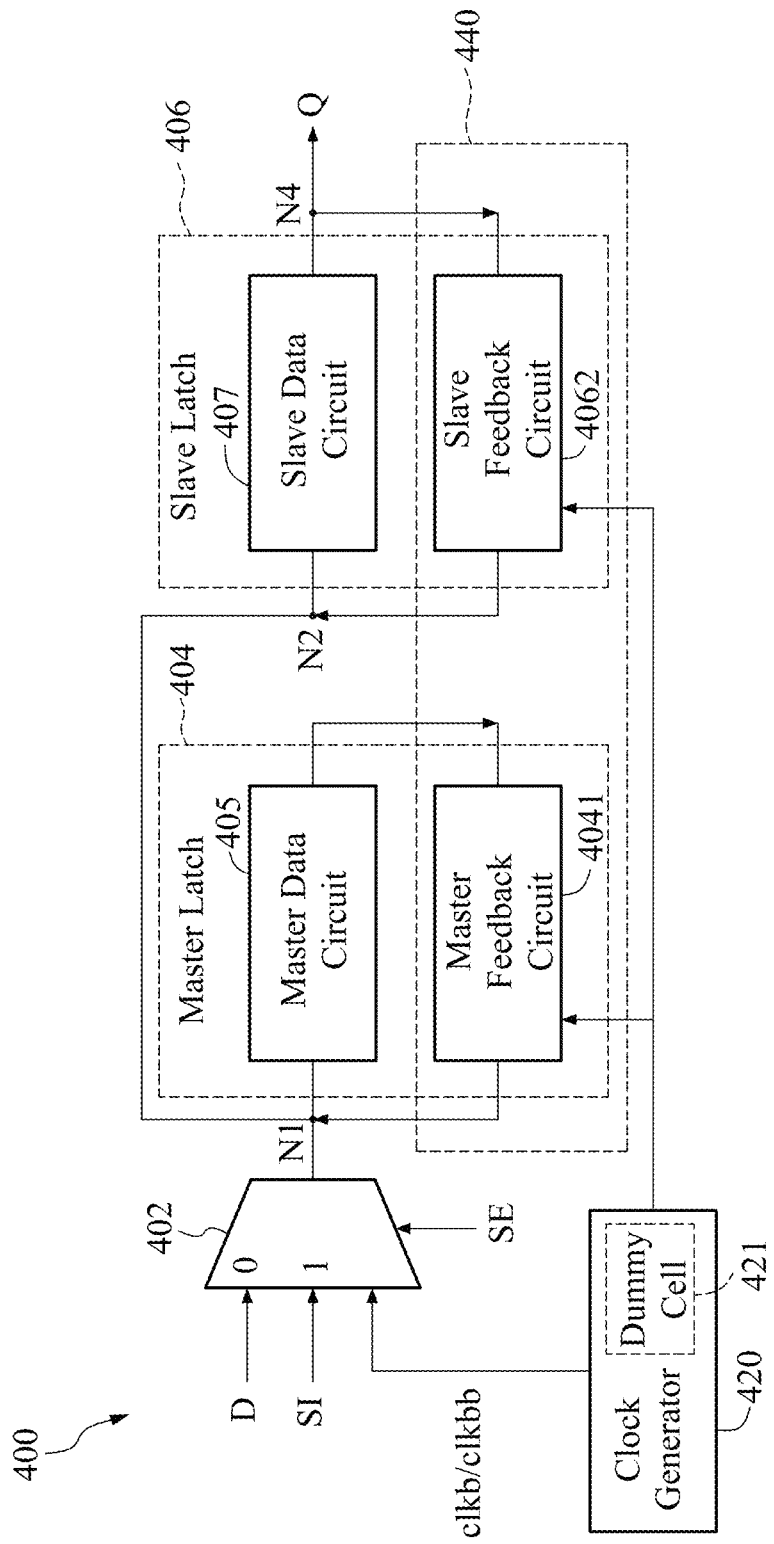
FIG. 4A is a block diagram of a scannable D flip-flop 400 in accordance with another embodiment of the disclosure.
Figure 4B:
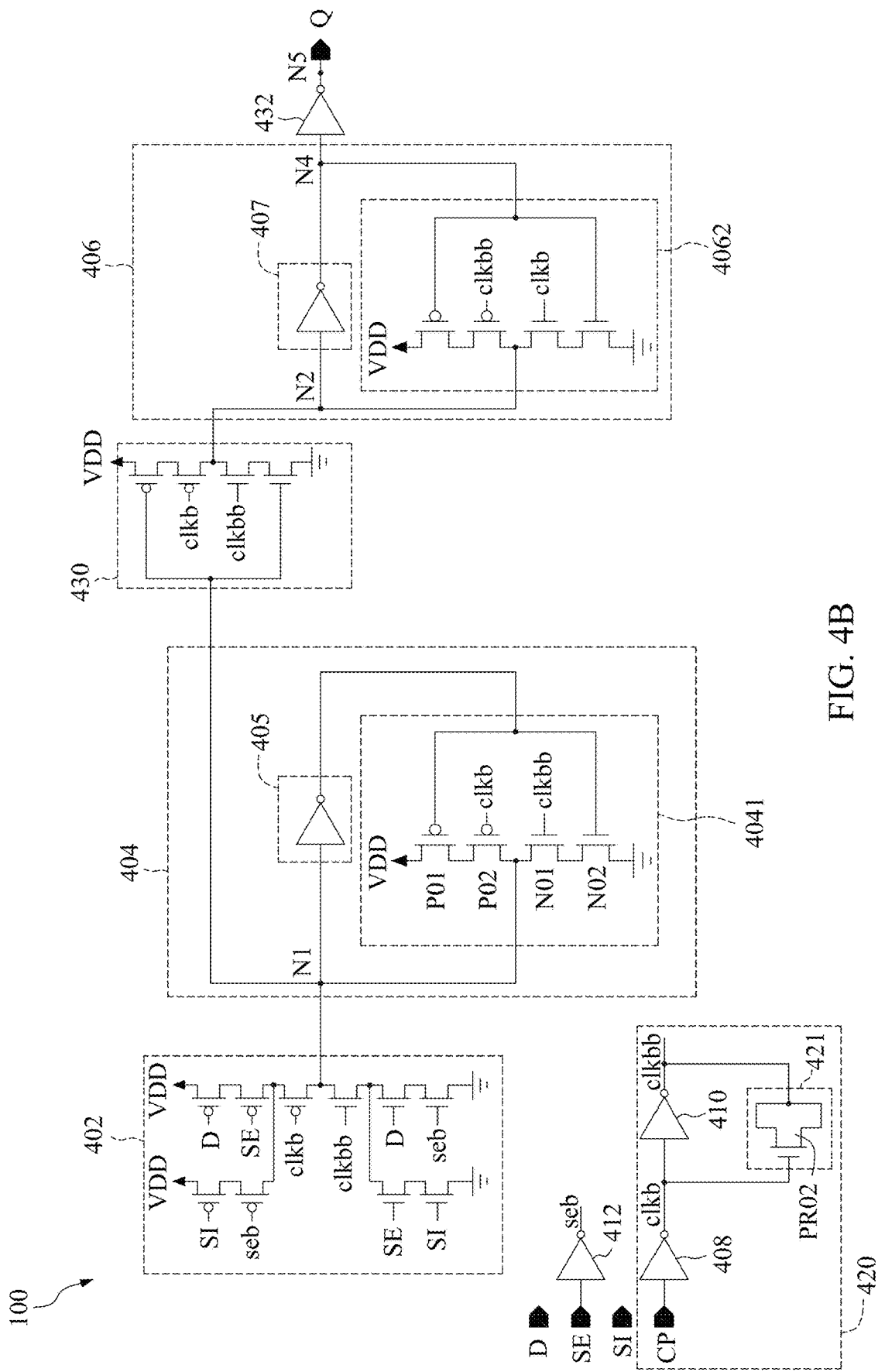
FIG. 4B is a schematic diagram of the scannable D flip-flop 400 in accordance with the embodiment of FIG. 4A.
Figure 4C:
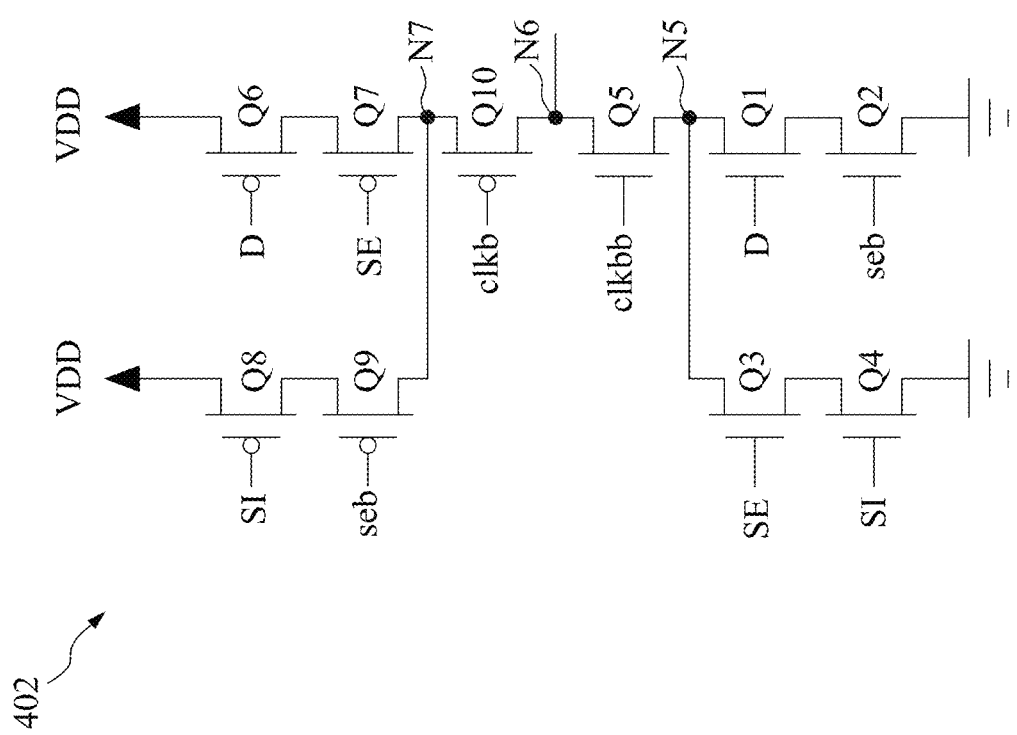
FIG. 4C is a schematic diagram of the multiplexer 402 in accordance with the embodiment of FIG. 4B.

FIG. 4A is a block diagram of a scannable D flip-flop 400 in accordance with another embodiment of the disclosure. FIG. 4B is a schematic diagram of the scannable D flip-flop 400 in accordance with the embodiment of FIG. 4A. FIG. 4C is a schematic diagram of the multiplexer 402 in accordance with the embodiment of FIG. 4B. Please refer to FIGS. 4A-4C.

In an embodiment, the scannable D flip-flop 400 shown in FIG. 4A has a master-slave latch structure similar to the scannable D flip-flop 100 of FIG. 1A. For example, the scannable D flip-flop 400 may include a multiplexer 402, a master latch 404, and a slave latch 406. The multiplexer 402 may select a data signal D or a scan input signal SI as its output signal according to a scan enable signal SE. For example, in response to the scan enable signal SE being in a high-logic state (e.g., '1'), the scannable D flip-flop enters the BIST mode, and the multiplexer 402 may select the scan input signal SI (e.g., from external test equipment), and output the inverse scan input signal SI' as its output signal at the output terminal (i.e., node N1) of the multiplexer 402. In response to the scan enable signal SE being in a low-logic state (e.g., '0'), the scannable D flip-flop enters the normal mode, and the multiplexer 402 may select the data signal D, and output the inverse data signal D as its output signal at the output terminal (i.e., node N1) of the multiplexer 402. In this case, the inverse data signal D' may be fed to the master latch 404 and the slave latch 406 that constitute a D flip-flop, so the inverse data signal D' can be retained by the master latch 404 and the slave latch 406.

It should be noted that although the inverse data signal D' is output by the multiplexer 402 when the scan enable signal SE is in the low-logic state, the logic state of the output signal Q may be aligned to that of the data signal D because the inverse data signal D1' at the output terminal (i.e., node N4 in FIG. 4B) of the slave latch 406 passes through the inverter 432 to obtain the output signal Q at the output terminal (node N5) of the scannable D flip-flop 400.

Specifically, when the scannable D flip-flop 400 is in the normal mode (i.e., SE=0), the inverse data signal D' may be transmitted to the master data circuit 405 of the master latch 404, and the output data of the master data circuit 405 is fed back to the output terminal (i.e., node N1) of the multiplexer 402 through the master feedback circuit 4041, as shown in FIG. 4A. In addition, the inverse data signal D' at node N1 is further sent to the slave data circuit 407 of the slave latch 406. The output data of the slave data circuit 407 (e.g., at node N4) is fed back to the input terminal (i.e., node N2) of the slave latch 406 through the slave feedback circuit 4062, as shown in FIG. 4A. For brevity, a clocked CMOS (complementary metal oxide semiconductor) inverter 430 coupled between nodes N1 and N2, and an inverter 432 coupled to node N4 are omitted from FIG. 4A, and the clocked CMOS inverter 430 and the inverter 432 are illustrated in the schematic diagram in FIG. 4B.

In this embodiment, a dummy cell 421 is disposed in a feedback path of the clock generator 420, as shown in FIG. 4B, and the dummy cell 421 can be implemented using the transistor PR02. For example, the critical path of the clock generator 420 may start from the clock input terminal CP to the output terminal of the inverter 410, and the non-critical path (i.e., a feedback path) may start from the output terminal of the inverter 410 to the output terminal of the inverter 408. The gate of the transistor PR02 is connected to the output terminal of the inverter 408, and the source and drain of the transistor PR02 are connected to the output terminal of the inverter 410. Thus, current leakage from the scannable D flip-flop 400 can be reduced, and the dummy cell 421 (i.e., transistor PR02) can be regarded as a leakage-free dummy cell.

It should be noted that the operations of the multiplexer 402 in FIG. 4B are controlled by the inverse clock signal clkb and the clock signal clkbb generated by the clock generator 420. Please refer to the schematic diagram of the multiplexer 402 in FIG. 4C. When the scannable D flip-flop 400 is in normal mode, the scan enable signal SE is in the low-logic state (i.e., '0'), and passes through the inverter 412 to generate the inverse scan enable signal seb which is in the high-logic state (i.e., '1'). Thus, the transistors Q3 and Q9 are turned off, and the transistors Q2 and Q7 turned on.

In addition, when the clock signal clkbb is in a high-logic state and the inverse clock signal clkb is in the low-logic state, the transistors Q5 and Q10 are turned on. At this time, when the data signal D is also in the high-logic state (e.g., '1'), the transistor Q1 is turned on, and the transistor Q6 is turned off. Thus, there is a current from node N6 to the ground through the transistors Q5, Q1, and Q2 in sequence, and thus node N6 is in the low-logic state. When the data signal D is in the low-logic state (e.g., '0'), the transistor Q1 is turned off, and the transistor Q6 is turned on. Thus, there is current from the power supply voltage VDD to node N6 through the transistors Q6, Q7, and Q10, and thus node N6 is in the high-logic state (e.g., '1').

Moreover, when the clock signal clkbb is in the low-logic state and the inverse clock signal is in the high-logic state, the transistors Q5 and Q10 are turned off, and thus the output terminal of the multiplexer 402 is in a high-Z (high impedance) state.

In view of the embodiments of FIGS. 4A-4B, the leakage current of the scannable D flip-flop 400 can be reduced, and the operating speed of the D flip-flop 400 can be improved.

Figure 5A:
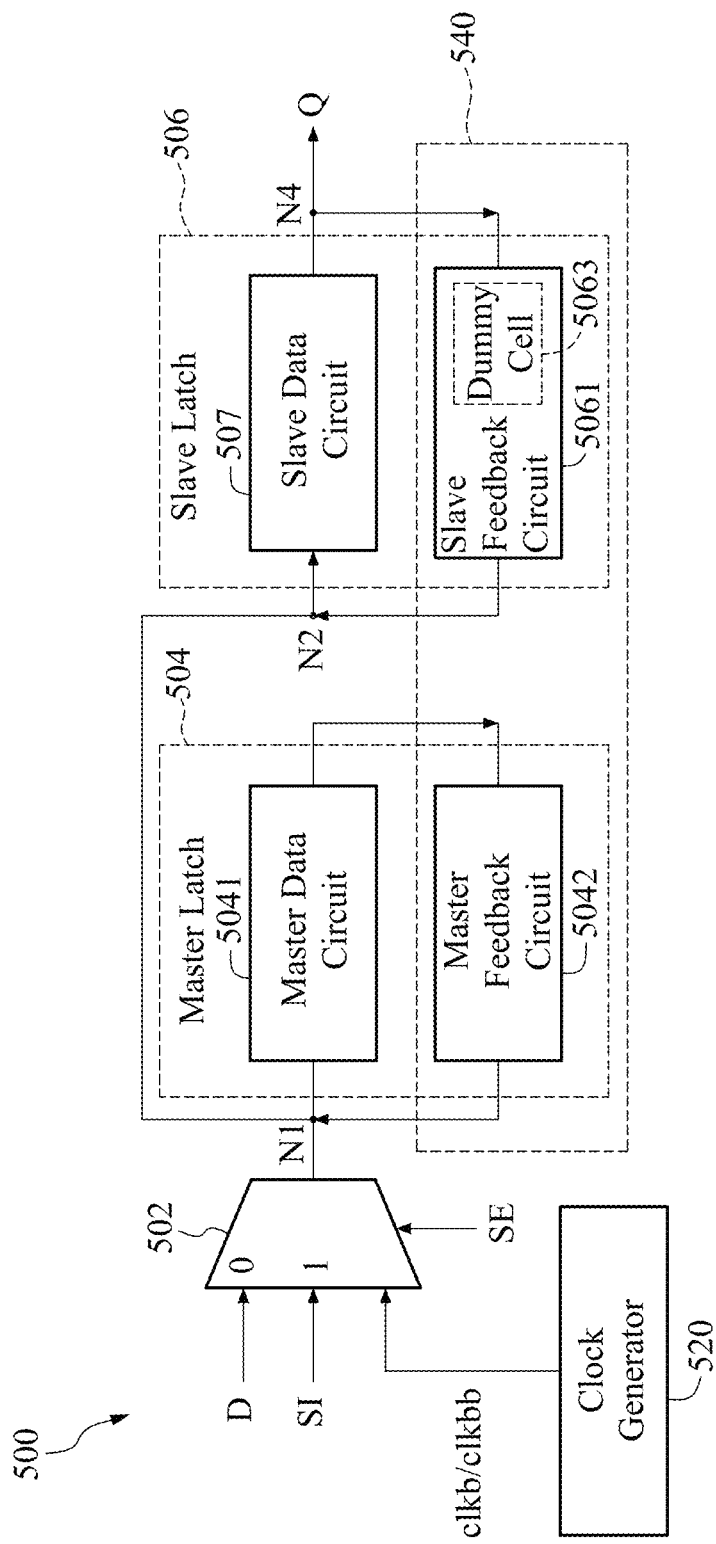
FIG. 5A is a block diagram of a scannable D flip-flop 500 in accordance with yet another embodiment of the disclosure.
Figure 5B:
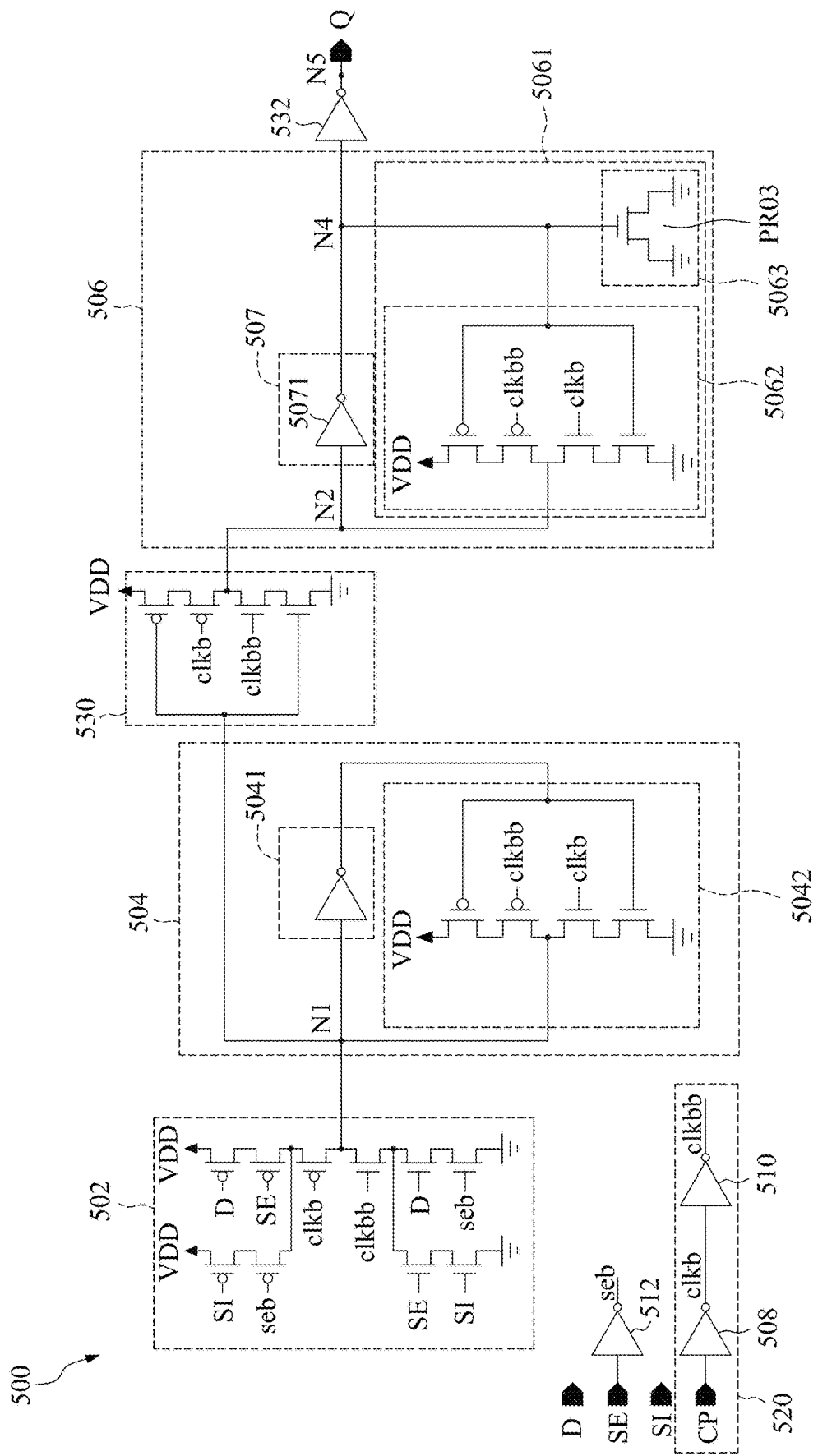
FIG. 5B is a block diagram of the scannable D flip-flop 500 in accordance with the embodiment of FIG. 5A.

FIG. 5A is a block diagram of a scannable D flip-flop 500 in accordance with yet another embodiment of the disclosure. FIG. 5B is a block diagram of the scannable D flip-flop 500 in accordance with the embodiment of FIG. 5A. Please refer to FIG. 5A and FIG. 5B.

In an embodiment, the scannable D flip-flop 500 shown in FIG. 5A has a master-slave latch structure similar to the scannable D flip-flop 100 shown in FIG. 1A. For example, the scannable D flip-flop 500 may include a multiplexer 502, a master latch 504, and a slave latch 506. The multiplexer 502 may select a data signal D or a scan input signal SI as its output signal according to a scan enable signal SE. For example, when responding to the scan enable signal SE being in a high-logic state (e.g., '1'), the scannable D flip-flop enters the BIST mode, and the multiplexer 502 may select the scan input signal SI (e.g., from external test equipment) as its output signal at the output terminal (i.e., node N1) of the multiplexer 502. In response to the scan enable signal SE being in a low-logic state (e.g., '0'), the scannable D flip-flop enters the normal mode, and the multiplexer 502 may select the data signal D as its output signal. In this case, the data signal D may be fed to the master latch 504 and the slave latch 506 that constitute a D flip-flop, so the data signal D can be retained by the master latch 504 and the slave latch 506.

Specifically, when the scannable D flip-flop 500 is in the normal mode (i.e., SE=0), the inverse data signal D at node N1 passes through the clocked CMOS inverter 530, as shown in FIG. 5B. The output signal at the output terminal (i.e., node N4) of the slave data circuit 507, implemented using inverter 5071, is fed back to node N2 through the slave feedback circuit 5062 implemented by a clocked CMOS inverter. The signal at node N4 passes through the inverter 532 to generate the output signal Q of the scannable D flip-flop 500. It should be noted that although the inverse data signal D' is output by the multiplexer 502 when the scan enable signal SE is in the low-logic state, the logic state of the output signal Q may be aligned to that of the data signal D because the inverse data signal D1' at the output terminal (i.e., node N5 in FIG. 5B) of the slave latch 506 passes through the inverter 532 to obtain the output signal Q.

In this embodiment, a dummy cell 5063 (e.g., implemented by transistor PR03) is disposed in a non-critical path of the scannable D flip-flop 500, as shown in FIG. 5B. For example, the critical path of the scannable D flip-flop 500 may refer to the data path from node N1 to the output terminal (i.e., node N4) of the scannable D flip-flop 500, and the aforementioned non-critical path may refer to the feedback path of the slave latch 506. The gate of the transistor PR03 is connected to the output terminal (i.e., node N4) of the inverter 5065, and the source and drain of the transistor PR03 are connected to the ground. Since the layout diagram of the transistor PR03 in FIG. 5B is very similar to that of the transistor PR01 in FIG. 2A or FIG. 2B, the layout diagram of the transistor PR03 in FIG. 5B is not shown here for brevity. In addition, the CPO region and CPODE region are removed from the transistor PR05 so as to further reduce the leakage current of the scannable D flip-flop 500. Therefore, the leakage current of the scannable D flip-flop 500 can be significantly reduced, and the dummy cell 5063 (i.e., transistor PR03) can be regarded as a leakage-free dummy cell. Similar to the embodiments of FIGS. 1A-1B, the leakage current of the scannable D flip-flop 500 in FIGS. 5A-5B can be reduced, and the operating speed of the D flip-flop 500 can be improved.

Figure 6A:
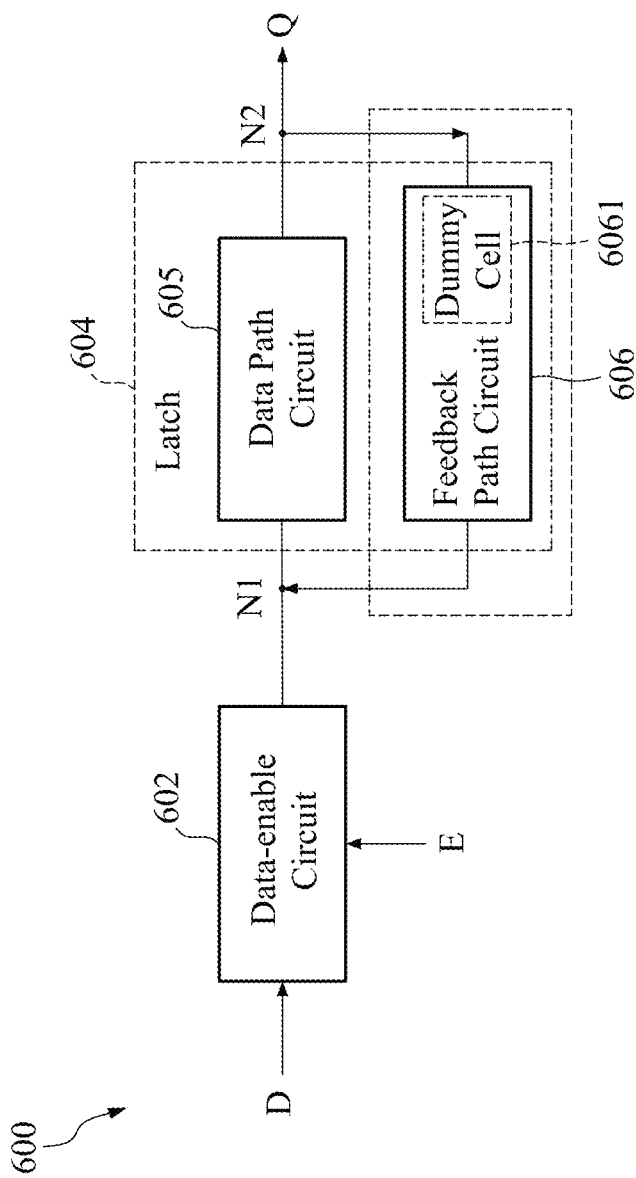
FIG. 6A is a block diagram of a data latch 600 in accordance with an embodiment of the disclosure.
Figure 6B:
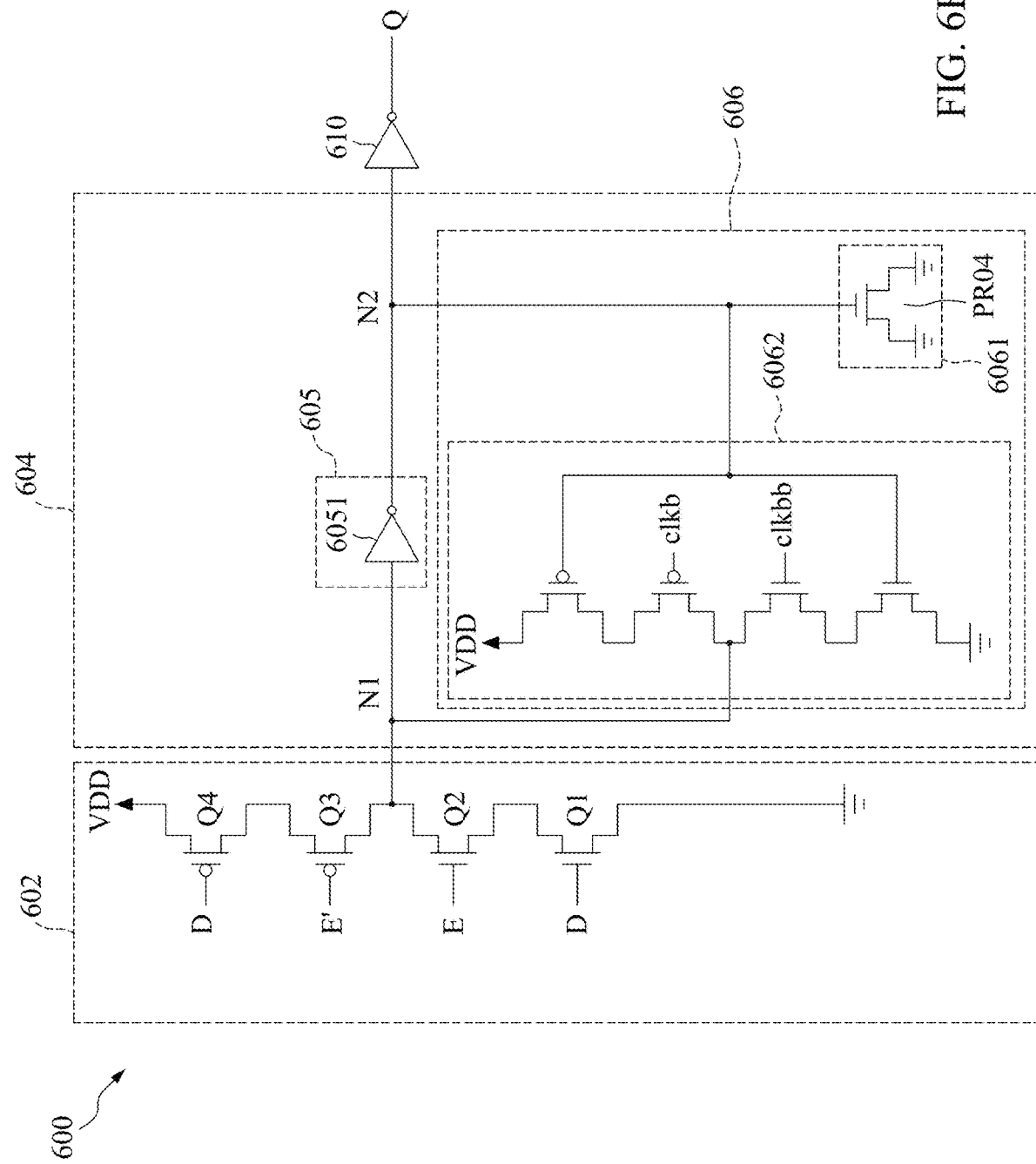
FIG. 6B is a schematic diagram of the data latch 600 in accordance with the embodiment of FIG. 6A.

FIG. 6A is a block diagram of a data latch 600 in accordance with an embodiment of the disclosure. FIG. 6B is a schematic diagram of the data latch 600 in accordance with the embodiment of FIG. 6A. Please refer to FIG. 6A and FIG. 6B.

The technique for adding a dummy cell in a non-critical path of the scannable D flip-flop as disclosed in the embodiments of FIGS. 1 to 5 can also be applied to the data latch 600 in FIG. 6A. For example, the data latch 600 may include a data-enable circuit 602 and a latch 604, as shown in FIG. 6A. The data-enable circuit 602 may determine whether to output the data signal D (or an inverse data signal D') to the latch 604 according to the enable signal E. For example, in response to the enable signal E being in a low-logic state, the data-enable circuit 602 will not output the data signal D (or the inverse data signal D') to the latch 604, and the output signal Q of the latch 604 will be maintained at the latched value. In response to the enable signal E being in a high-logic state, the multiplexer 602 will output the data signal D (or the inverse data signal D') to the latch 604, and the output signal Q of the latch 604 will be set to the data signal D.

In some embodiments, the enable signal E may be the clock signal clkbb as shown in the embodiments 1 to 5. That is, when the clock signal clkbb is in the high-logic state, the data-enable signal 602 outputs the data signal D (or the inverse data signal D') at its output terminal (node N1), and thus the data signal D can be latched by the latch 604. When the clock signal clkbb is in the low-logic state, the output terminal (node N1) of the data-enable circuit will be in a high-Z state, and the value latched by the latch 604 will not be changed.

The latch 604 includes a data path circuit 605 and a feedback path circuit 606. The input signal (e.g., the data signal D or inverse data signal D') at node N1 is latched by the latch 604. For example, the data path circuit 605 may be implemented by the inverter 6051, as shown in FIG. 6B. The feedback path circuit 606 may include a dummy cell 6061 and a clocked CMOS inverter 6062. The signal at node N1 is inverted by the inverter 6051, and an inverse signal is obtained at node N2. The inverse signal is fed back to node N1 through the clocked CMOS inverter 6062. It should be noted that the dummy cell 6061 is placed in the non-critical path of the latch 604 which is similar to the techniques described in the embodiments in FIGS. 1 to 5. For example, the dummy cell 6061 may be implemented using the transistor PR04. The gate of the transistor PR04 is connected to node N2, and the source and drain of the transistor PR04 is connected to the ground. Thus, the leakage current of the data latch 600 can be significantly reduced due to the transistor PR04, where the transistor PR04 can be regarded as a leakage-free dummy cell. Similarly, the leakage current of the data latch in FIGS. 6A-6B can be reduced, and the operating speed of the data latch 600 can be increased.

Figure 7A:
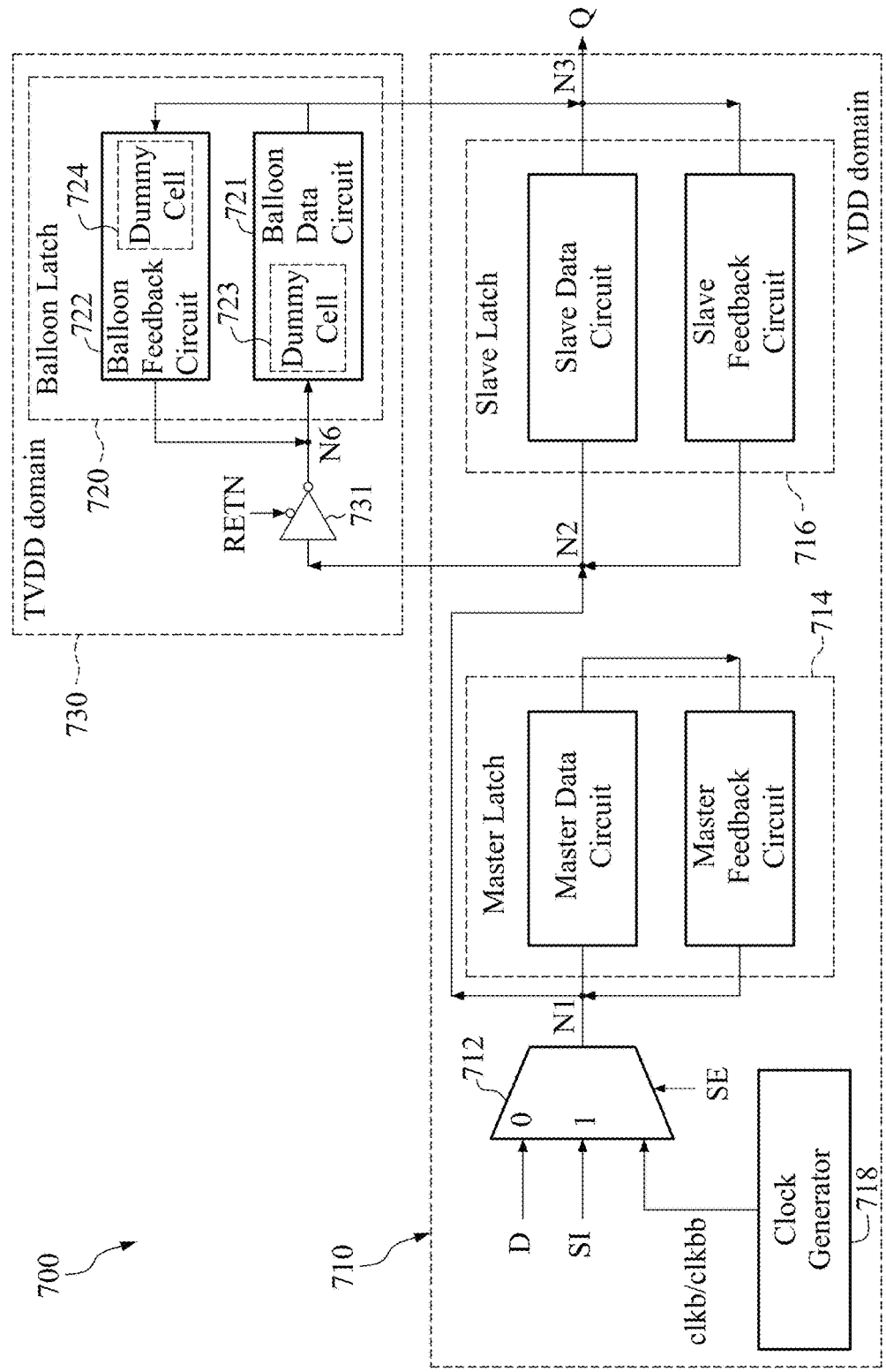
FIG. 7A is a block diagram of a retention flip-flop in accordance with yet another embodiment of the disclosure.
Figure 7B:
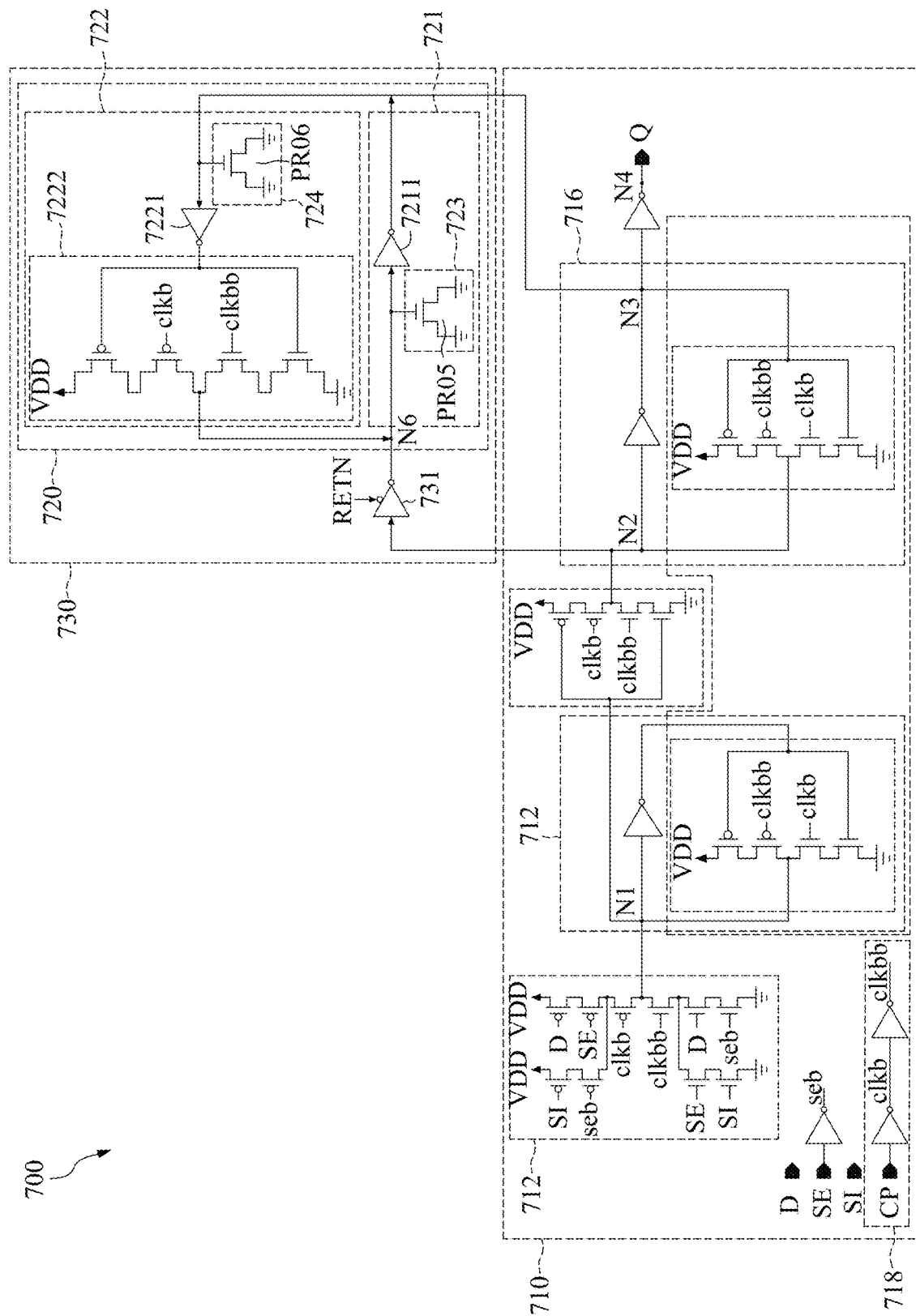
FIG. 7B is a schematic diagram of the retention flip-flop in accordance with the embodiment of FIG. 7A.

FIG. 7A is a block diagram of a retention flip-flop in accordance with yet another embodiment of the disclosure. FIG. 7B is a schematic diagram of the retention flip-flop in accordance with the embodiment of FIG. 7A. Please refer to FIGS. 7A-7B.

The retention flip-flop 700 may include a scannable D flip-flop 710 and a balloon latch 720. The scannable D flip-flop 710 may be similar to the scannable D flip-flop 100 shown in FIG. 1A, and implemented by a master-slave latch structure, as shown in FIG. 7A. For example, the scannable D flip-flop 710 may include a multiplexer 712, a master latch 714, and a slave latch 716. The balloon latch 720 may be connected to the input terminal (i.e., node N2) of the slave latch 716 through the inverter 731 supplied with a retention signal RETN.

It should be noted that the scannable D flip-flop 710 is operated in the domain of the first power supply voltage VDD, and the balloon latch 720 and the inverter 731 in block 730 are operated in the domain of the second power supply voltage TVDD. The second power supply voltage TVDD is higher than the first power supply voltage VDD. In addition, the scannable D flip-flop 710 may be designed from low Vt transistors whereas the balloon latch 720 is design with weak high Vt transistors. The devices in block 730 (i.e., including inverter 731 and transistors/pass gates in the balloon latch 720) are connected to an always-on power supply (True VDD, or abbreviated as TVDD) and holds the register state while the scannable D flip-flop 710 is powered down in the sleep mode. The devices in the scannable D flip-flop 710 are powered by a virtual VDD source, i.e., a VDD source that goes low during power down/sleep mode. The two sets of devices may have different threshold voltages (Vt), gate lengths, junction doping concentrations, gate oxide thickness, substrate biases, etc.

The operations of devices in the scannable D flip-flop 710 in FIG. 7A are similar to those in the scannable D flip-flop 100 in FIG. 1A, and thus details thereof are not recited here.

The balloon latch 720 may include a balloon data circuit 721 and a balloon feedback circuit 722. The data signal at node N2 may pass through the inverter 731 controlled by a retention signal RENT, and an inverse data signal is obtained at node N6. Thus, the inverse data signal at node N6 is maintained by the balloon latch 720.

In addition, the balloon data circuit 721 may include a dummy cell 723, and the balloon feedback circuit 722 may include a dummy cell 724, where the dummy cells 723 and 724 can be implemented using transistors PR05 and PR06, as shown in FIG. 7B. It should be noted that the dummy cells 723 and 724 are disposed on the non-critical path of the balloon latch 720. For example, the critical path of the balloon latch 720 may be a feedback loop from node N6 to itself through inverter 7211, inverter 7211, and the clocked CMOS inverter 7222. Specifically, the gate of transistor PR05 is connected to node N6, and the source and drain of transistor PR05 is connected to the ground. The gate of transistor PR06 is connected to node N3, and the source and drain of transistor PR06 is connected to the ground. Thus, the leakage current of the balloon latch 720 can be significantly reduced, and thus the leakage current of the retention flip-flop can be reduced as well.

It should be noted that the techniques for disposing the dummy cell(s) in the non-critical path of the scannable D flip-flop, data latch, or retention flip-flop in different embodiments can be practiced alone or in combination. For example, the scannable D flip-flop 710 in the retention flip-flop 700 can also use techniques disclosed in the embodiments of FIGS. 1A-1B, 4A, 4B, and 5A-5B to dispose the dummy cell in the master-latch feedback path, clock generator, and/or slave-latch feedback path so as to reduce the leakage current of the retention flip-flop 700.

In an embodiment, the present disclosure provides a semiconductor device, which includes a multiplexer, a master latch, and a slave latch. The multiplexor outputs an inverse of an input data signal or an inverse scan input signal according to a scan enable signal. The master latch is coupled to an output terminal of the multiplexer, and is configured to latch the inverse of the input data signal based on an input clock signal in response to the scan enable signal being in a low-logic state. The slave latch is coupled to the output terminal of the multiplexer through a first clocked CMOS inverter, and is configured to receive the input data signal and to output a latched slave latch data based on the input clock signal. A leakage-free dummy cell is disposed in a non-critical path of the master latch and the slave latch.

In another embodiment, the present disclosure provides a semiconductor device, which includes a data-enable circuit and a latch. The data-enable circuit is configured to output a data signal to an output terminal in response to an enable signal. The latch is configured to latch a data signal from the output terminal. The latch includes a leakage-free dummy cell disposed in a feedback path of the latch.

In yet another embodiment, the present disclosure provides a semiconductor device, which includes a scannable D flip-flop and a balloon latch. The scannable D flip-flop includes a master latch and a slave latch. The balloon latch is coupled to an input terminal of the slave latch through an inverter. The balloon latch includes a balloon data circuit and a balloon feedback circuit. A first leakage-free dummy cell and a second leakage-free dummy cell are disposed in the balloon data circuit and the balloon feedback circuit, respectively.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A semiconductor device, comprising:
 a multiplexer, configured to output an inverse of an input data signal or an inverse of a scan input signal according to a scan enable signal;
 a master latch, coupled to an output terminal of the multiplexer, and configured to latch the inverse of the input data signal based on an input clock signal in response to the scan enable signal being in a low-logic state; and
 a slave latch, coupled to the output terminal of the multiplexer through a first clocked CMOS inverter, and configured to receive the input data signal and to output a latched slave latch data based on the input clock signal,
 wherein a leakage-free dummy cell is disposed in a non-critical path of the master latch and the slave latch.

2. The semiconductor device of claim 1, wherein the master latch comprises:
 a master data circuit, configured to invert the inverse of the input data signal to generate a first signal; and
 a master feedback circuit, configured to feed the first signal back to the output terminal of the multiplexer.

3. The semiconductor device of claim 2, wherein the master data circuit is implemented by a first inverter, and the master feedback circuit is implemented by a second clocked CMOS inverter.

4. The semiconductor device of claim 2, wherein the leakage-free dummy cell is implemented using an N-type transistor, a gate of the N-type transistor is connected to an output terminal of the master data circuit, and a source and a drain of the N-type transistor are grounded.

5. The semiconductor device of claim 3, wherein the second clocked CMOS inverter comprises a first N-type transistor, a second N-type transistor, a first P-type transistor, and a second P-type transistor that are connected in series,
    wherein a source of the first P-type transistor is connected to a power supply voltage, and a gate of the first P-type transistor is connected to the first signal, and a drain of the first P-type transistor is connected to a source of the second P-type transistor,
    wherein a gate of the second P-type transistor is connected to an inverse input clock signal, and a drain of the second P-type transistor is connected to a drain of the first N-type transistor and the output terminal of the multiplexer,
    wherein a source of the first N-type transistor is connected to a drain of the second N-type transistor, and a gate of the first N-type transistor is connected to the input clock signal, and
    wherein a gate of the second N-type transistor is connected to the first signal, and a source of the second N-type transistor is grounded.

6. The semiconductor device of claim 5, wherein the first P-type transistor is formed on a first intersection region between a first oxide diffusion (OD) region and a first polysilicon in a layout of a scannable D flip-flop, and the first N-type transistor is formed on a second intersection region between a second OD region and the first polysilicon in the layout,
    wherein the second P-type transistor is formed on a third intersection region between the first OD region and a first portion of a second polysilicon in the layout, and the third intersection region is placed next to the first intersection region on the first OD region, and
    wherein the first polysilicon is substantially parallel to the second polysilicon, and the first OD region is substantially parallel to the second OD region.

7. The semiconductor device of claim 6, wherein the first N-type transistor is formed on a fourth intersection region between the second OD region and a second portion of the second polysilicon, and the first portion and the second portion of the second polysilicon are spaced apart by a cut-poly-off (CPO) region.

8. The semiconductor device of claim 7, wherein the second N-type transistor is formed on a fifth intersection region between the second OD region and a third polysilicon, and the second N-type transistor is disposed next to the first N-type transistor on the first OD region,
    wherein the third polysilicon is substantially parallel to the first polysilicon and the second polysilicon.

9. The semiconductor device of claim 8, wherein a gate metal is formed on the first intersection region, and is connected to a power supply voltage.

10. The semiconductor device of claim 8, wherein a gate metal is formed on the second intersection region, and is connected to a power supply voltage.

11. The semiconductor device of claim 1, wherein the slave latch comprises:
    a slave data circuit, configured to receive the input data signal from an output terminal of the first clocked CMOS inverter, and to generate a second signal; and
    a slave feedback circuit, configured to feed the second signal back to the output terminal of the first clocked CMOS inverter.

12. The semiconductor device of claim 11, wherein the slave data circuit is implemented by a second inverter, and the slave feedback circuit is implemented by a third clocked CMOS inverter.

13. The semiconductor device of claim 12, wherein the leakage-free dummy cell is implemented using an N-type transistor, and a gate of the N-type transistor is connected to an output terminal of the slave data circuit, and a source and a drain of the N-type transistor are grounded.

14. The semiconductor device of claim 1, further comprising: a clock generator, configured to generate the input clock signal and an inverse input clock signal from a clock pulse signal,
    wherein the clock generator comprises a first inverter and a second inverter connected in series, and the first inverter is configured to receive the clock pulse signal and generate the inverse input clock signal at a first output terminal of the first inverter, and the second inverter is configured to receive the inverse input clock signal and generates the input clock signal at a second output terminal of the second inverter.

15. The semiconductor device of claim 14, wherein the clock generator further comprises a leakage-free dummy cell implemented using a N-type transistor, and a gate of the N-type transistor is connected the first output terminal, and a source and a drain of the N-type transistor are connected to the second output terminal.

16. A semiconductor device, comprising:
    a data-enable circuit, configured to output a data signal to an output terminal in response to an enable signal; and
    a latch, configured to latch the data signal from the output terminal, and the latch comprises a leakage-free dummy cell disposed in a feedback path of the latch.

17. The semiconductor device of claim 16, wherein the latch comprises a data path circuit and a feedback path circuit that are implemented using an inverter and a clock CMOS inverter, respectively,
    wherein the inverter is configured to receive the data signal from the output terminal and generate a first signal,
    wherein the leakage-free dummy cell is implemented using an N-type transistor, and
    wherein a gate of the N-type transistor is connected to the first signal, and a drain and a source of the N-type transistor are grounded.

18. A semiconductor device, comprising:
    a scannable D flip-flop, comprising: a master latch and a slave latch; and
    a balloon latch, coupled to an input terminal of the slave latch through an inverter, wherein the balloon latch comprises a balloon data circuit and a balloon feedback circuit,
    wherein a first leakage-free dummy cell and a second leakage-free dummy cell are disposed in the balloon data circuit and the balloon feedback circuit, respectively.

19. The semiconductor device of claim 18, wherein the scannable D flip-flop is configured to operate with a first power supply voltage, and the balloon latch is configured to operate with a second power supply voltage, and the second power supply voltage is higher than the first power supply voltage.

20. The semiconductor device of claim 19, wherein the first leakage-free dummy cell and the second leakage-free dummy cell are implemented using a first N-type transistor and a second N-type transistor, respectively, wherein the inverter receives an data signal from the input terminal of the slave latch, and generates a first signal, wherein the balloon data circuit is configured to invert the first signal to generate a second signal;

wherein a gate of the first N-type transistor is connected to the first signal, and a source and a drain of the first N-type transistor are grounded, and wherein a gate of the second N-type transistor is connected to the second signal, and a source and a drain of the second N-type transistor are grounded.

* * * * *